United States Patent [19]

Ohki et al.

[11] Patent Number: 4,884,170
[45] Date of Patent: Nov. 28, 1989

[54] MULTILAYER PRINTED CIRCUIT BOARD AND METHOD OF PRODUCING THE SAME

[75] Inventors: Nobuaki Ohki; Norio Sengoku, both of Hadano; Fumiyuki Kobayashi, Sagamihara, all of Japan

[73] Assignee: Hitachi, Ltd., Tokyo, Japan

[21] Appl. No.: 484,891

[22] Filed: Apr. 14, 1983

[30] Foreign Application Priority Data

Apr. 16, 1982 [JP] Japan .................. 57-62410

[51] Int. Cl.[4] .............................................. H05K 1/11
[52] U.S. Cl. .................................................. 361/414
[58] Field of Search ...................... 361/414, 412, 395; 174/68.5

[56] References Cited

U.S. PATENT DOCUMENTS

| | | | |
|---|---|---|---|
| 3,102,213 | 8/1963 | Bedson et al. | 361/414 X |
| 3,760,091 | 9/1973 | Cannizzaro et al. | 361/414 X |
| 3,795,047 | 3/1974 | Abolafia et al. | 361/412 X |
| 3,867,759 | 2/1975 | Siefker | 361/414 X |

OTHER PUBLICATIONS

"Reinforcement of Printed Circuits", Archer et al., IBM Tech. Discl. Bull., vol. 13, No. 8, Jan. 71, (2296).
"Multilayer Circuit Board", Cannizzaro et al., IBM Tech. Discl. Bull., vol. 13, No. 7, Dec. 70, (2075).
"Plating Thru–Holes in Circ. Boards", ... Schuessler et al., IBM Tech. Discl. Bull., vol. 13, No. 7, Dec. 70, (1831).
"Multilayer Printed Circ. Panel", Haddad, IBM Tech. Discl. Bull., vol. 12, No. 8, Jan. 70, (1191).

Primary Examiner—Vit W. Miska
Attorney, Agent, or Firm—Antonelli, Terry & Wands

[57] ABSTRACT

A multilayer printed circuit board having a plurality of printed circuit boards each having opposite surfaces respectively provided with an electric source or ground layer and a signal circuit layer. The plurality of printed circuit boards is stacked through adhesive layers such that the electric source or ground layer and the signal circuit layer are alternately disposed, the characteristic impedance of each signal circuit layer is given by a thickness and material of each of the substrate and the adhesive sheet disposed between the signal circuit layer and one of two electric source or ground layers adjacent to the signal circuit layer and between the same signal circuit layer and the other electric source or ground layer.

7 Claims, 1 Drawing Sheet

U.S. Patent    Nov. 28, 1989    4,884,170
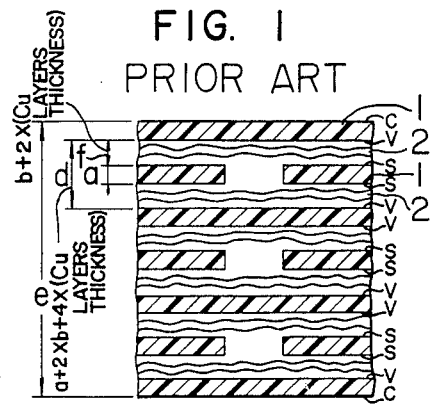
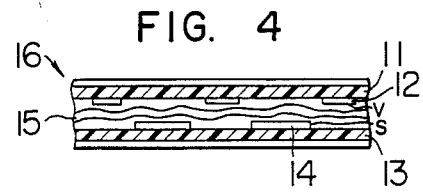
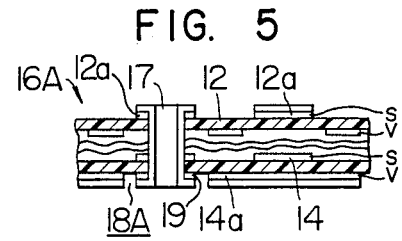
FIG. 2
| DIMENSION \ MATERIAL | CONVENTIONAL MATERIAL | LOW DIELECTRIC CONSTANT MATERIAL |
|---|---|---|
| a | 0.11 mm | 0.05 mm |
| b | 0.13 | 0.08 |
| d | 0.45 | 0.3 |
| e | 2.0 | 1.5 |
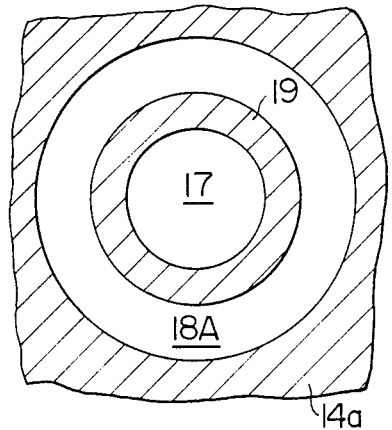
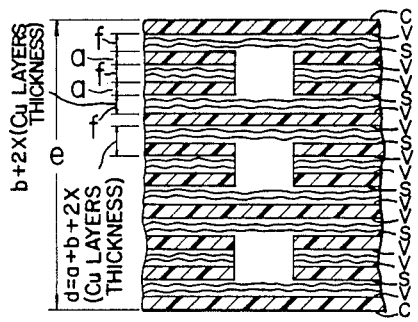
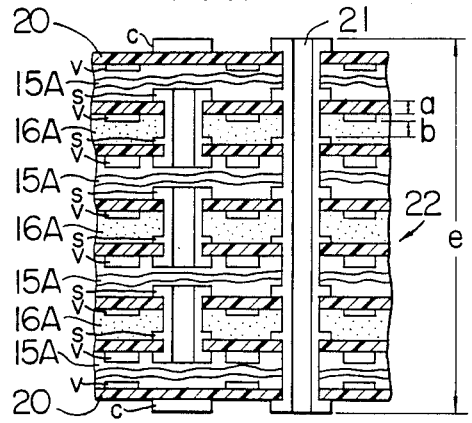

MULTILAYER PRINTED CIRCUIT BOARD AND METHOD OF PRODUCING THE SAME

BACKGROUND OF THE INVENTION

The present invention relates to a multilayer printed circuit board and, more particularly, to a multi-through-hole multilayer printed circuit board employing a material having a low dielectric constant.

In view of the recent demand for high density printed circuit boards, a technique has been developed for forming signal circuit patterns in inner layers, and connecting the inner layer signal circuits to each by partial-layer through holes. To produce signal circuit patterns in inner layers, it is required to limit the impedence of signal lines to a predetermined value. To satisfy this requirement, efforts have been made to design a space between a signal layer and an electric source or ground layer, hereinafter referred to as a source/ground layer, disposed in opposition to the signal layer. Such efforts have been concerned with taking into account the thickness of the insulating layer of each of the copper-plated lamination layer plates forming a multilayer printed circuit board, the thickness of each adhesive sheet layer after formation of the multilayer, a width of each of the signal lines, as well as the dielectric constant of each of the insulating layers.

However, since the material commonly used in the prior art has been limited to glass epoxy or glass polyimide, it is difficult to freely select the dielectric constant of the insulating layer and, since the signal line width is also largely limited by virtue of the print wiring density, it is difficult to freely select the signal line width in high density printed circuit boards. Furthermore, since it is common to form signal circuit patterns on both opposite surfaces of one copper-plated lamination layer in order to facilitate the formation of a multi-through hole multilayer printed circuit board, in practice, two signal layers are generally sandwiched between two source/ground layers and a thickness of the insulating layer sandwiched between the two source/-ground layers is controlled so as to obtain a predetermined impedance.

More particularly, where, for example, two signal lines are passed between two through hole pads on one surface of a glass polyimide copper plated lamination plate and are arranged at a pitch of 50 mil (1.27 mm) in order to obtain an impedance of 50Ω, the signal line width will be about 0.1 mm by the wiring density and the thickness of the insulating layer will be about 0.45 mm. If a multi-through hole multilayer printed circuit board having six signal circuit layers is constructed in accordance with the above noted conditions, a multilayer printed circuit board of fourteen layers and of a thickness of 2.0 mm can be obtained by combining copper-plated lamination plates each of which includes an insulating layer having a thickness of 0.11 mm and adhesive sheets each of which have a thickness of 0.05 mm.

Furthermore, in view of the recent demand for an increase in the manufacturing of printed circuit boards, materials for low diaelectric constant copper-plated lamination plates and adhesive sheets have been developed so that a glass butadiene, copper-plated lamination plate having a dielectric constant of 3.5 or less, which dielectric constant is about three-quarters of that of a conventional glass-epoxy or glass polymid copper-plated lamination plate, has recently been put into practical use. This is based on the fact that the propagating speed of an electric signal is determined on the basis of the dielectric constant and magnetic permeability of the material through which the electric signal propagates.

To freely use the copper-plated lamination plates and adhesive sheets, measures are required to particularly counter an increase in dimensional variations of the copper-plated lamination plate, as well as measures to avoid the occurrence of a void adhesive substance phenomenon, that is, an existence of a residual air layer in the adhesive layer, in the multilayer bonding process. Additionally, further measures are required to preclude the occurrence of wrinkles and/or the breakage of the copper-laminated plates and adhesive sheets during the handling thereof.

The aim underlying the present invention essentially resides in providing a multilayer printed circuit board and a method for producing the same in which a material having a low dielectric constant can be used without increasing the overall processing or total costs in production of the circuit board. In accordance with advantageous features of the present invention, it is possible to provide a multilayer printed circuit board and method of producing the same which has substantially the same thickness as conventional multilayer printed circuit boards and which employs an insulating material having a dielectric constant which is lower than the dielectric constant of the insulating materials employed in conventional circuit boards.

In accordance with advantageous features of the present invention, a multi-layer printed circuit board is provided wherein a plurality of copper-plated lamination plates, each of which are provided on opposite sides with a signal layer and a source-ground layer respectively, are stacked in such a manner that the signal layer and the source/ground layer are alternately disposed.

In accordance with further advantageous features of the present invention, an insulating layer between a signal layer and a source/ground layer is constituted by an insulating layer of a copper-plated lamination plate and an adhesive layer.

The above objects, features, and advantages of the present invention will become more apparent from the following description when taken in connection with the accompanying drawings which show, for the purpose of illustration only, one embodiment in accordance with the present invention.

BRIEF DESCRIPTION OF THE DRAWINGS

FIG. 1 is a cross-sectional view of a conventional multi-through hole multilayer printed circuit board;

FIG. 2 is a table depicting a dimensional comparison;

FIG. 3 is a cross-sectional view of an example of a multilayer printed circuit board constructed in accordance with the present invention;

FIGS. 4, 5, and 7 are cross-sectional views depicting the individual steps for producing a multilayer printed circuit board constructed in accordance with the present invention; and FIG. 6 is a plan view of the multilayer printed circuit board of FIG. 5.

DETAILED DESCRIPTION

Referring now to the drawings wherein like reference numerals are used throughout the various views to designate like parts and, more particularly, to FIG. 1, according to this figure, a prior art multilayer printed circuit board of a thickness of 2.0 mm is provided which includes a plurality of copper laminated plates 1 each of which have an insulating layer of a thickness of 0.1 mm, and with adhesive sheets 2 each of which have a thickness of 0.05 mm. The copper-plated lamination plates are provided on both sides with copper layers which respectively form cap layers, source/ground layers and signal layers c, v, and s. The two signal layers s are sandwiched or disposed between two source/ground layers v in order to increase the mounting density. That is, the multilayer printed circuit board is constituted by repeating the basic structure of v-s-s-v so as to form six signal layers s.

When producing a high density multi-through hole multilayer printed circuit board by using a material of a low dielectric constant, in order to obtain the same impedance with the same signal line width, it is necessary to largely reduce the thickness (d) of the insulating layer sandwiched or disposed between the two source/ground layers v. This is due to the fact that the characteristic impedance is determined on the basis of the dielectric constant and magnetic permeability of the surroundings of the signal lines and the distance between the signal line and source/ground layer and, therefore, if the dielectric constant is lowered, it is necessary to reduce a distance between the signal line and source/ground layer in order to obtain the same impedance.

For example, with a fourteen-layer printed circuit board employing a material of a low dielectric constant of, for example, 3.5, the thickness d of the insulating layer sandwiched by the two source/ground layers is 0.3 mm which is about twothirds of a thickness of a conventional insulating layer so as to obtain an impedance of 50Ω, as shown most clearly in FIG. 2. In order to realize a thickness of d it is necessary for the respective thicknesses a and b of the instulating layer of the copper-plated lamination plate and the adhesive sheet to have a thickness of 0.05-0.08 mm thereby resulting in an insulating layer having the necessary thickness d. With such an arrangement, the thickness of the resultant printed circuit board will be about 1.5 mm.

To avoid the difficulties noted above in connection with the reduction in the thickness of the insulating layer, in accordance with the present invention, a multilayer printed circuit board is provided wherein a thickness of each insulating layer affecting the characteristic impedance is relatively small while nevertheless employing copper-plated lamination plates and adhesive sheets having substantially the same thickness as employed in conventional multi-layer printed circuit boards.

As shown in FIG. 3, one signal layer is sandwiched or disposed between two source/ground layers so as to reduce the thickness of each of the characteristic-impedance-related insulating layers. More particularly, the multi-layer printed circuit board is arranged such that a first group of copper-plated lamination plates, each of which are provided on respective opposite sides thereof with a signal layer and a source/ground layer, and a second group of copper-plated plates, each of which are provided on respective opposite surfaces thereof with a source/ground layer are stacked in such a manner that two of the first group of copper-plated plates are disposed with respective source/ground layers disposed in opposition to each other and sandwiching therebetween one of the second group of copper-plated plates. Thus, the arrangement of repetition of the basic v-s-v layers is readily realized in contradistinction to the conventional arrangement of the repetition of the basic v-s-s-v layers so as to make it possible to ensure a predetermined impedance with substantially the same thickness of each of the insulating layers of the copper-plated lamination plates and the adhesive sheets forming the insulating layer of the board as in conventional constructions.

However, with such an arrangement, since two source/ground layers are disposed between each pair of signal layers, the resulting circuit board will have some twenty layers and a thickness of the printed circuit board will be about 3.1 mm thereby creating a problem of not only an increase in the cost but also in a difficulty in the working of small holes due to the increase in the thickness of the printed circuit board.

In accordance with the present invention, a multi-through hole multilayer printed circuit board may be provided which has a thickness of about 0.1 mm in signal line width with the circuit board being provided with six signal layers and a 50Ω characteristic impedance while nevertheless employing copper-plated lamination plates each of which include an insulating layer made of a glass polybutadiene having a dielectric constant of 3.5.

In accordance with the present invention, the signal layer and the source/ground layer are alternately arranged, that is, one source/ground layer is commonly used for two signal layers disposed on opposite sides of the source/ground layer. Consequently, the total number of layers in the entire printed circuit board is decreased while the number of signal layers is unaltered in comparison with, for example, the construction illustrated in FIG. 3.

As shown most clearly in FIG. 4, in accordance with the method of production of a multi-through hole printed circuit board in accordance with the present invention, a copper-plated lamination plate 11, provided on one surface thereof with a source/ground layer 2, and a copper-plated lamination plate 13, provided on one surface with a signal layer 14, are stacked and bonded to each other by way of an adhesive sheet 15 sandwiched or disposed therebetween so as to obtain a multilayer plate generally designated by the reference numeral 16 having four layers.

In the second step of the method in accordance with the present invention, as shown most clearly in FIG. 5, a small through-hole 17 is formed in a predetermined position of the multilayer plate 18 and the entire surface of the multilayer plate 18, including the inner surface of the small hole 17, is plated with copper. At this time, as shown most clearly in FIG. 6, a through-hole pad 19 is disposed interiorly of a through-hole clearance pattern 18 constituting a portion of the source/ground layer 14a, with the pad 19 having an inner diameter which is sufficiently larger than a diameter of the small through-hole 17, and an outer diameter which is smaller than the inner diameter of the through-hole clearance pattern 18 so as to provide a determined gap 18A therebetween. After the copper plating, a signal layer 12a and a source/ground layer 14a are formed on opposite surfaces of the plate 16 so as to result in the formation of a multilayer plate generally designated by the reference numeral 16A (FIG. 5). A pair of signal layer patterns 12a and 14 are connected to each other by the through-hole copper plating of the small through-hole 17.

As shown most clearly in FIG. 7, three of the multilayer plates 16A are stacked and sandwiched by copper-plated lamination plates 20, with respective plates 16A being bonded with adhesive sheets 15A disposed therebetween. Subsequently, the through-hole 21 is provided and plated thereby forming multilayer patterns in a conventional manner.

By virtue of the above noted steps in accordance with the present invention, a multi-through-hole multilayer printed circuit board 22 is provided having insulating layers f each of which has a thickness of 0.13 mm by using copper-plated lamination plates each of which have a thickness of 0.12 mm and adhesive sheets having a thickness of 0.05 mm. As a result of the present invention, it is possible to allow the number of layers to be increased from the conventional fourteen layers to sixteen layers while the entire thickness e of the multilayer printed circuit board has a thickness of 2.4 mm representing only an increase of 0.4 mm over conventional printed circuit boards.

As described above, in accordance with the present invention, a method is provided for producing a multi-through-hole multilayer printed circuit board wherein a plurality of copper-plated lamination plates formed with circuit patterns including through holes are stacked and bonded with adhesive sheets provided therebetween and, subsequently, a through-hole is passed through the entire thickness of the stacked and bonded plates and outer layer circuit patterns are formed. A signal layer and a source/ground layer are alternately disposed, with each signal layer being sandwiched by an insulating layer of the copper-plated lamination plate and the adhesive sheet between adjacent two source/ground layers, so that there is a remarkable advantage in that it is possible to produce a low dielectric constant multi-through-hole multilayer printed circuit board by using copper-plated lamination plates, each of which has an insulating layer made of a low dielectric constant material while nevertheless enabling the realization of a circuit board having the same thickness as a conventional circuit board. Furthermore, with the circuit board of the present invention, it is possible to manufacture the same without employing thin copper-plated lamination plates which are subject to adverse effects during the handling and bonding working therebetween and also to provide a circuit board employing copper-plated lamination plates which does not increase the thickness in the printed circuit board.

While we have shown and described only one embodiment in accordance with the present invention, it is understood that the same is not limited thereto but is susceptible to numerous changes and modifications as known to one having ordinary skill in the art, and we therefore do not wish to be limited to the details shown and described herein, but intend to cover all such modifications as are encompassed by the scope of the appended claims.

We claim:

1. A method of producing a multilayer printed circuit board the method comprising the steps of:
   (a) forming an electric source or ground layer and a signal circuit layer on opposite copper-plated surfaces of each of a plurality of copperplated lamination insulating plates, said electric source or ground layer and said signal circuit layer being respectively disposed on opposite surfaces; and
   (b) stacking and bonding said plurality of copper-plated plates each subjected to the processing in step (a) so as to dispose said signal circuit layer and said electric source or ground layer alternately.

2. A method of producing a multilayer printed circuit board according to claim 1, further comprising the steps of:
   (c) forming a hole passing through said copper-plated lamination plates subjected to the processing in step (b) in a predetermined position of said plates and forming a conductive layer at least on an inner surface of said hole;
   (d) stacking and bonding a plurality of stacks of said copper-plated lamination plates subjected to processing in step (c), such that the electric source or ground layer and said signal circuit layer are alternately disposed; and
   (e) forming another hole passing through said stacked and bonded copper-plated lamination plates subjected to the processing in step (d) in a predetermined position of said plates and forming a conductive layer at least on an inner surface of said other hole.

3. A multilayer printed circuit board comprising:
   a plurality of individual printed circuit boards each including an insulating layer having opposite surfaces on which an electric source or ground layer and a signal circuit layer are respectively formed, said plurality of individual printed circuit boards being stacked such that said electric or ground layer and said signal circuit layer are alternately disposed; and
   adhesive layers respectively disposed between adjacent ones of said plurality of individual printed circuit boards to bond said printed circuit boards to each other.

4. A multilayer printed circuit board according to claim 3, further comprising a hole passing through a plurality of adjacent printed circuit boards and having a conductive layer formed on its inner surface.

5. A multilayer printed circuit board according to claim 3, further comprising a first hole passing through two adjacent printed circuit boards and having a conductive layer formed on its inner surface, and a second hole passing through all of said plurality of printed circuit boards and having a conductive layer formed on its inner surface.

6. A multilayer printed circuit board comprising a plurality of printed circuit boards each including an insulating substrate provided on its opposite surfaces with conductive layers, said plurality of printed circuit boards being stacked with adhesive layers inserted therebetween, said conductive layers being respectively formed on opposite surfaces of each of said plurality of printed circuit boards, said conductive layers respectively forming a signal circuit layer and an electric source or ground layer, said plurality of printed circuit boards being stacked such that the signal circuit layer and the electric source or ground layer are alternately disposed, only one insulating substrate exists between any one of the signal circuit layers and one of the two of the electric source or ground layers disposed adjacent to said one signal circuit layer and only one adhesive layer exists between said one signal circuit layer and the other of said two adjacent electric source or ground layers.

7. A method of producing a multilayer printed circuit board, the method comprising the steps of:

(a) forming an electric source or ground layer and a signal circuit layer on opposite copper-plated surfaces of each of a plurality of copper-plated lamination insulating plates, said electric source or ground layer and said signal circuit layer being respectively disposed on opposite surfaces; and (b) stacking said plurality of copper-plated plates each subjected to the processing in step (a) by inserting adhesive layers therebetween, such that one of said insulating plates and one of said adhesive layers exists between the two source or ground layers sandwiching one of said signal circuit layers.

* * * * *